United States Patent
Kim et al.

(10) Patent No.: US 9,251,306 B2
(45) Date of Patent: Feb. 2, 2016

(54) ALIGNMENT NET INSERTION FOR STRAIGHTENING THE DATAPATH IN A FORCE-DIRECTED PLACER

(71) Applicant: GLOBALFOUNDRIES Inc., Grand Cayman (KY)

(72) Inventors: Myung-Chul Kim, Austin, TX (US); Natarajan Viswanathan, Austin, TX (US); Samuel I. Ward, Austin, TX (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 52 days.

(21) Appl. No.: 13/826,631

(22) Filed: Mar. 14, 2013

(65) Prior Publication Data

US 2013/0205272 A1 Aug. 8, 2013

Related U.S. Application Data

(63) Continuation of application No. 13/275,105, filed on Oct. 17, 2011, now Pat. No. 8,453,093.

(51) Int. Cl.
*G06F 17/50* (2006.01)

(52) U.S. Cl.
CPC .......... *G06F 17/5072* (2013.01); *G06F 17/50* (2013.01)

(58) Field of Classification Search
None
See application file for complete search history.

(56) References Cited

U.S. PATENT DOCUMENTS

| | | | |
|---|---|---|---|
| 5,987,086 A | 11/1999 | Raman et al. | |
| 6,757,878 B2 * | 6/2004 | Srinivasan et al. | 716/122 |
| 6,792,585 B1 | 9/2004 | Ku et al. | |
| 7,266,796 B1 | 9/2007 | Chu et al. | |
| 7,350,174 B2 * | 3/2008 | Srinivasan et al. | 716/122 |
| 7,739,646 B2 | 6/2010 | Lin et al. | |
| 7,752,588 B2 | 7/2010 | Bose | |
| 7,904,848 B2 | 3/2011 | Coene et al. | |
| 7,921,392 B2 | 4/2011 | Furnish et al. | |
| 8,793,636 B2 * | 7/2014 | Alpert et al. | 716/119 |
| 2006/0053396 A1 | 3/2006 | Eng | |
| 2012/0266124 A1 | 10/2012 | Alpert et al. | |

OTHER PUBLICATIONS

Roy, Jarrod, et al., "Seeing the Forest and the Trees: Steiner Wirelength Optimization in Placement," IEEE Trans. on Computer-Aided Design, vol. 26, No. 4, pp. 632-644 (Apr. 2007).

* cited by examiner

*Primary Examiner* — Annette Thompson
(74) *Attorney, Agent, or Firm* — Heslin Rothenberg Farley & Mesiti P.C.

(57) ABSTRACT

An automated method for aligning a critical datapath in an integrated circuit design inserts an artificial alignment net in the netlist which interconnects all cells in the bit stack of the datapath. The cells are placed using a wirelength optimization which assigns weights to wire sections based on the alignment direction. The rate of change of the alignment weighting value can vary during different stages of global placement. The invention is particularly suited for a force-directed placer which uses a linear system solver to obtain a globally optimum solution for placement of the cells having some overlap among the cells, and thereafter spreads the cells to reduce the overlap. Pseudo nets are also inserted which interconnect a cell and an expected location of the cell after spreading for that iteration.

20 Claims, 4 Drawing Sheets

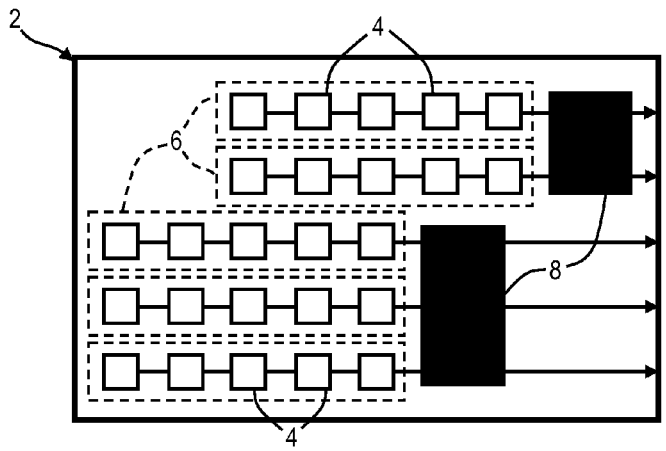
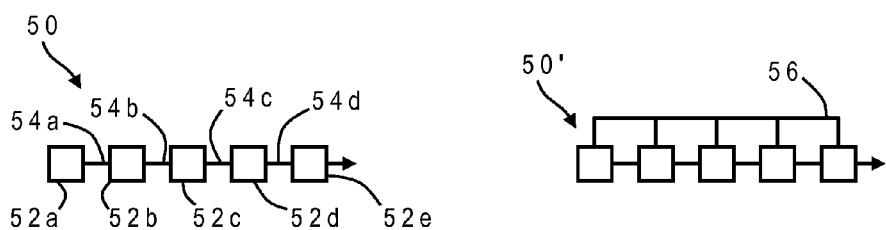
FIG. 3A
FIG. 3B
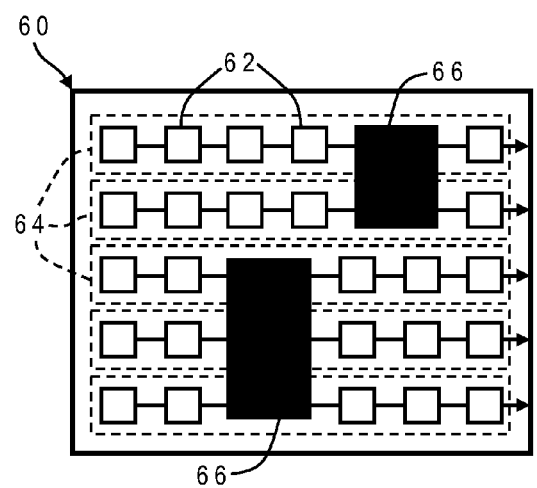
FIG. 4

ALIGNMENT NET INSERTION FOR STRAIGHTENING THE DATAPATH IN A FORCE-DIRECTED PLACER

BACKGROUND OF THE INVENTION

1. Field of the Invention

The present invention generally relates to the design of semiconductor chips and integrated circuits, and more particularly to a method of placing components of an integrated circuit design in a layout.

2. Description of the Related Art

Integrated circuits are used for a wide variety of electronic applications, from simple devices such as wristwatches, to the most complex computer systems. A microelectronic integrated circuit (IC) chip can generally be thought of as a collection of logic cells with electrical interconnections between the cells, formed on a semiconductor substrate (e.g., silicon). An IC may include a very large number of cells and require complicated connections between the cells. A cell is a group of one or more circuit elements such as transistors, capacitors, resistors, inductors, and other basic circuit elements combined to perform a logic function. Cell types include, for example, core cells, scan cells, input/output (I/O) cells, and memory (storage) cells. Each of the cells of an IC may have one or more pins, each of which in turn may be connected to one or more other pins of the IC by wires. The wires connecting the pins of the IC are also formed on the surface of the chip. For more complex designs, there are typically at least four distinct layers of conducting media available for routing, such as a polysilicon layer and three metal layers (metal-1, metal-2, and metal-3). The polysilicon layer, metal-1, metal-2, and metal-3 are all used for vertical and/or horizontal routing.

An IC chip is fabricated by first conceiving the logical circuit description, and then converting that logical description into a physical description, or geometric layout. This process is usually carried out using a "netlist," which is a record of all of the nets, or interconnections, between the cell pins, including information about the various components such as transistors, resistors and capacitors. A layout typically consists of a set of planar geometric shapes in several layers. The layout is then checked to ensure that it meets all of the design requirements, particularly timing requirements. The result is a set of design files known as an intermediate form that describes the layout. The design files are then run through a dataprep process that is used to produce patterns called masks by an optical or electron beam pattern generator. During fabrication, these masks are used to etch or deposit features in a silicon wafer in a sequence of photolithographic steps using a complex lens system that shrinks the mask image. The process of converting the specifications of an electrical circuit into such a layout is called the physical design.

Cell placement in semiconductor fabrication involves a determination of where particular cells should optimally (or near-optimally) be located on the surface of a integrated circuit device. Due to the large number of components and the details required by the fabrication process for very large scale integrated (VLSI) devices, physical design is not practical without the aid of computers. As a result, most phases of physical design extensively use computer-aided design (CAD) tools, and many phases have already been partially or fully automated. Automation of the physical design process has increased the level of integration, reduced turn around time and enhanced chip performance. Several different programming languages have been created for electronic design automation (EDA), including Verilog, VHDL and TDML. A typical EDA system receives one or more high level behavioral descriptions of an IC device, and translates this high level design language description into netlists of various levels of abstraction.

Physical synthesis is prominent in the automated design of integrated circuits such as high performance processors and application specific integrated circuits (ASICs). Physical synthesis is the process of concurrently optimizing placement, timing, power consumption, crosstalk effects and the like in an integrated circuit design. This comprehensive approach helps to eliminate iterations between circuit analysis and place-and-route. Physical synthesis has the ability to repower gates (changing their sizes), insert repeaters (buffers or inverters), clone gates or other combinational logic, etc., so the area of logic in the design remains fluid. However, physical synthesis can take days to complete, and the computational requirements are increasing as designs are ever larger and more gates need to be placed. There are also more chances for bad placements due to limited area resources. Given a netlist N=(V, E) with nodes (vertices) V and nets (edges) E, a global placement tool obtains locations $(x_i, y_i)$ for all the movable nodes, such that the area of nodes within any rectangular region does not exceed the area of cell sites in that region. Though some work has looked at general Steiner wirelength optimization, placers typically minimize the half-perimeter wirelength (HPWL) of the design. Modern placers often approximate HPWL by a differentiable function using a quadratic objective.

One placement technique that has proven to be a viable alternative to simulated annealing or top-down partitioning methods is known as force-directed placement. A force-directed placement tool essentially relies on two main operations: (a) a linear system solver operation that obtains a globally optimum solution for a given set of constraints and design objectives (this solution typically generates a result that has significant overlap among the cells), and (b) a spreading operation is performed to reduce the overlap among the cells by spreading their relative placement and thereby add additional "spreading" constraints to the result generated by the linear system solver operation. These two operations are carried out in an iterative manner to reduce overlap among the cells until a stopping criterion is met, such as when there is no appreciable reduction in the HPWL spread solution, when the average movements of modules due to spreading constraints converges, or when the average density of the cells with respect to a certain regular grid structure is smaller than a predefined threshold. The spreading operation does not actually move the cells, but only determines expected locations of the cells that provide a reasonable reduction in overlap. Once the spreading operation is performed to obtain expected locations, spreading forces are added to the design to reduce overlap among the cells. These spreading forces may be added by inserting pseudo pins and pseudo nets in the design.

Force-directed placers provide continuous trajectories for cell locations and are therefore particularly amenable to timing- and congestion-driven placement as well as physical re-synthesis. The SimPL algorithm is one example of a flat, force-directed global placer. It maintains a lower-bound placement and an upper-bound placement, and progressively narrows the displacement between the two to yield a final placement solution. The upper-bound placement is generated by applying lookahead legalization (LAL), which is based on top-down geometric partitioning and non-linear scaling.

SimPL provides improvements in speed and solution quality while allowing easy integration with other optimizations.

SUMMARY OF THE INVENTION

The present invention is generally directed to a method of placing cells in a layout of an integrated circuit design by receiving a circuit description of the integrated circuit design which includes cells interconnected to form true nets, designating a preferred direction for cell alignment in the layout, identifying a set of the cells defining a datapath which is to be aligned along the preferred direction, inserting in the circuit description an artificial alignment net which interconnects all cells in the set, and placing the cells in the layout using a wirelength optimization which assigns weights to wire sections of nets based on the preferred direction. In an example wherein the preferred direction is horizontal, the placer assigns weights to vertical wire sections that are greater than weights assigned to horizontal wire sections. The rate of change of the alignment weighting value preferably increases slowly during the initial stages of global placement, increases more rapidly during the middle stages, and slows again near the end of global placement. The same alignment net persists in the design for multiple global placement iterations. This approach provides for alignment of the datapath while retaining the flexibility to move individual cells so that one cell in a bit stack can be on a first side of a blockage in the layout, and other cells in the bit stack can be on an opposite side of the blockage but still aligned, resulting in more efficient area usage. The invention is particularly suited for a force-directed placer which uses a linear system solver to obtain a globally optimum solution for placement of the cells having some overlap among the cells, and thereafter spreads the cells to reduce the overlap. In the illustrative embodiment, pseudo nets are additionally inserted which interconnect a cell and an expected location of the cell after spreading for that iteration.

The above as well as additional objectives, features, and advantages of the present invention will become apparent in the following detailed written description.

BRIEF DESCRIPTION OF THE DRAWINGS

The present invention may be better understood, and its numerous objects, features, and advantages made apparent to those skilled in the art by referencing the accompanying drawings.

FIG. 1 is a plan view of a simplified layout for an integrated circuit design illustrating manual blocking of groups of cells to form aligned datapaths in accordance with a conventional technique;

FIGS. 3A and 3B are pictorial illustrations of a bit stack having four true nets and an added artificial alignment net constructed in accordance with the present invention;

FIG. 4 is a plan view of a simplified layout for an integrated circuit design illustrating how a datapath may be aligned with more flexible placement of the bit stack around blockages in accordance with one implementation of the present invention;

The use of the same reference symbols in different drawings indicates similar or identical items.

DESCRIPTION OF THE PREFERRED EMBODIMENT(S)

Current microprocessor trends are integrating traditionally custom designs with random logic macros (RLMs) into very large integrated circuit designs. In some cases, entire microprocessor units are designed using an automated synthesis flow that integrates these traditional custom designs and RLMs. This type of merged synthesis run is referred to as large block synthesis (LBS). The LBS blocks, i.e., sets of cells or logic modules, require handling dataflow designs differently than traditional RLMs. In particular, as the size of the designs grow, there is a need for improved automated datapath design. Conventional placement tools typically result in designs with critical datapaths that zig-zag and criss-cross all over the layout area.

It would accordingly be desirable to devise an improved placer which could straighten out these datapaths, but with current placement models there is no way to provide a constraint to tell the placer that a datapath should be straight. Weighting can be applied to the nets but this attempted workaround disrupts timing aware placement and can result in significant wirelength degradation. An alternative approach is to manually pack the group of cells for a given datapath (the bit stack), and then move the bit stack as a unit. An example of this method is illustrated in FIG. 1. A simplified layout 2 for an integrated circuit design includes a plurality of cells 4 which are interconnected to form five separate datapaths along a preferred horizontal direction. The cells for the respective datapaths have been grouped into bit stacks 6. Once so grouped, the placement tool can only move bit stacks, not individual cells, although some random logic may still float around. Two different placers are required, to first place the datapath, and then separately place the random logic. This approach also creates wirelength and timing issues, and is particularly inefficient in the presence of blockages 8 such as fixed macros or proprietary blocks (IP), resulting in increased layout area. The present invention provides a mechanism to align the bit stacks in a design without the rigid constraints inherent in such manual packing That mechanism includes an artificial alignment net for the datapath which persists throughout the multiple iterations of global placement.

Figure 2:
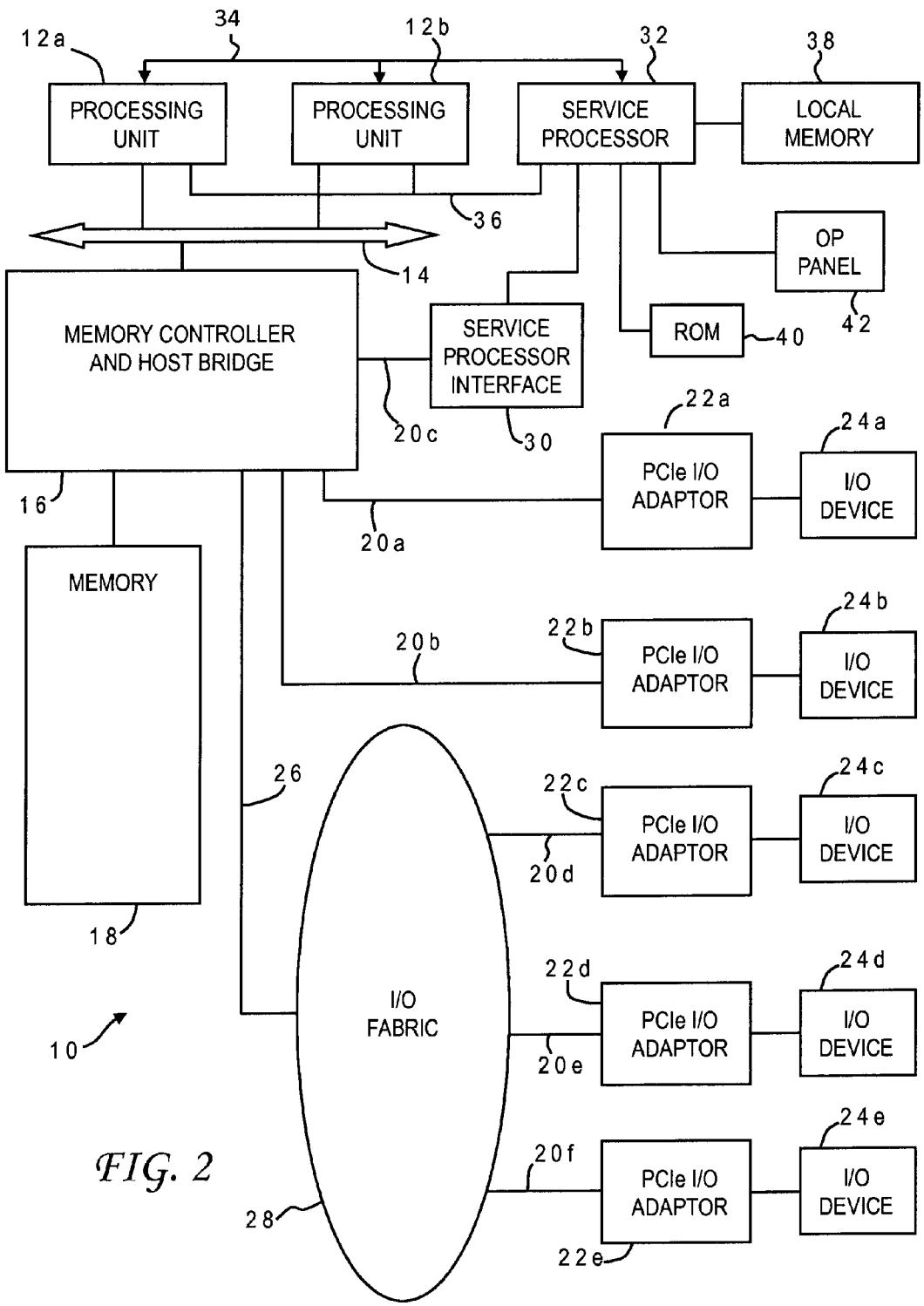
FIG. 2 is a block diagram of a computer system programmed to carry out integrated circuit design placement in accordance with one implementation of the present invention.

With reference now to the figures, and in particular with reference to FIG. 2, there is depicted one embodiment 10 of a computer system in which the present invention may be implemented to carry out the placement of logic structures in an integrated circuit design. Computer system 10 is a symmetric multiprocessor (SMP) system having a plurality of processors 12a, 12b connected to a system bus 14. System bus 14 is further connected to a combined memory controller/host bridge (MC/HB) 16 which provides an interface to system memory 18. System memory 18 may be a local memory device or alternatively may include a plurality of distributed memory devices, preferably dynamic random-access memory (DRAM). There may be additional structures in the memory hierarchy which are not depicted, such as on-board (L1) and second-level (L2) or third-level (L3) caches.

MC/HB 16 also has an interface to peripheral component interconnect (PCI) Express links 20a, 20b, 20c. Each PCI Express (PCIe) link 20a, 20b is connected to a respective PCIe adaptor 22a, 22b, and each PCIe adaptor 22a, 22b is connected to a respective input/output (I/O) device 24a, 24b. MC/HB 16 may additionally have an interface to an I/O bus 26 which is connected to a switch (I/O fabric) 28. Switch 28 provides a fan-out for the I/O bus to a plurality of PCI links 20d, 20e, 20f. These PCI links are connected to more PCIe adaptors 22c, 22d, 22e which in turn support more I/O devices 24c, 24d, 24e. The I/O devices may include, without limitation, a keyboard, a graphical pointing device (mouse), a microphone, a display device, speakers, a permanent storage device (hard disk drive) or an array of such storage devices, an optical disk drive, and a network card. Each PCIe adaptor provides an interface between the PCI link and the respective I/O device. MC/HB 16 provides a low latency path through which processors 12a, 12b may access PCI devices mapped anywhere within bus memory or I/O address spaces. MC/HB 16 further provides a high bandwidth path to allow the PCI devices to access memory 18. Switch 28 may provide peer-to-peer communications between different endpoints and this data traffic does not need to be forwarded to MC/HB 16 if it does not involve cache-coherent memory transfers. Switch 28 is shown as a separate logical component but it could be integrated into MC/HB 16.

In this embodiment, PCI link 20c connects MC/HB 16 to a service processor interface 30 to allow communications between I/O device 24a and a service processor 32. Service processor 32 is connected to processors 12a, 12b via a JTAG interface 34, and uses an attention line 36 which interrupts the operation of processors 12a, 12b. Service processor 32 may have its own local memory 38, and is connected to read-only memory (ROM) 40 which stores various program instructions for system startup. Service processor 32 may also have access to a hardware operator panel 42 to provide system status and diagnostic information.

In alternative embodiments computer system 10 may include modifications of these hardware components or their interconnections, or additional components, so the depicted example should not be construed as implying any architectural limitations with respect to the present invention. The invention may further be implemented in an equivalent cloud computing network.

When computer system 10 is initially powered up, service processor 32 uses JTAG interface 34 to interrogate the system (host) processors 12a, 12b and MC/HB 16. After completing the interrogation, service processor 32 acquires an inventory and topology for computer system 10. Service processor 32 then executes various tests such as built-in-self-tests (BISTs), basic assurance tests (BATs), and memory tests on the components of computer system 10. Any error information for failures detected during the testing is reported by service processor 32 to operator panel 42. If a valid configuration of system resources is still possible after taking out any components found to be faulty during the testing then computer system 10 is allowed to proceed. Executable code is loaded into memory 18 and service processor 32 releases host processors 12a, 12b for execution of the program code, e.g., an operating system (OS) which is used to launch applications and in particular the circuit design application of the present invention, results of which may be stored in a hard disk drive of the system (an I/O device 24). While host processors 12a, 12b are executing program code, service processor 32 may enter a mode of monitoring and reporting any operating parameters or errors, such as the cooling fan speed and operation, thermal sensors, power supply regulators, and recoverable and non-recoverable errors reported by any of processors 12a, 12b, memory 18, and MC/HB 16. Service processor 32 may take further action based on the type of errors or defined thresholds.

As will be appreciated by one skilled in the art, the present invention may be embodied as a system, method or computer program product. Accordingly, the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, the present invention may take the form of a computer program product embodied in any tangible medium of expression having computer usable program code embodied in the medium.

Any combination of one or more computer usable or computer readable media may be utilized. The computer-usable or computer-readable medium may be, for example but not limited to, an electronic, magnetic, optical, electromagnetic, infrared, or semiconductor system, apparatus, device, or propagation medium. More specific examples (a non-exhaustive list) of the computer-readable medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CDROM), an optical storage device, a transmission media such as those supporting the Internet or an intranet, or a magnetic storage device. The computer-usable or computer-readable medium could even be paper or another suitable medium upon which the program is printed, as the program can be electronically captured, via, for instance, optical scanning of the paper or other medium, then compiled, interpreted, or otherwise processed in a suitable manner, if necessary, and then stored in a computer memory. In the context of this invention, a computer-usable or computer-readable medium may be any medium that can contain, store, communicate, propagate, or transport the program for use by or in connection with the instruction execution system, apparatus, or device. The computer-usable medium may include a propagated data signal with the computer-usable program code embodied therewith, either in baseband or as part of a carrier wave. The computer usable program code may be transmitted using any appropriate medium, including but not limited to wireless, wireline, optical fiber cable, RF, etc.

Computer program code for carrying out operations of the present invention may be written in any combination of one or more programming languages, including an object oriented programming language such as Java, Smalltalk, C++ or the like and conventional procedural programming languages, written for a variety of platforms such as an AIX environment or operating systems such as Windows 7 or Linux. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

The present invention is described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer-readable medium that can direct a computer or other programmable data processing apparatus to function in a particular manner, such that the instructions stored in the computer-readable medium produce an article of manufacture including instruction means which implement the function/act specified in the flowchart and/or block diagram block or blocks. Such storage media excludes transitory media.

The computer program instructions may further be loaded onto a computer or other programmable data processing apparatus to cause a series of operational steps to be performed on the computer or other programmable apparatus to produce a computer implemented process such that the instructions which execute on the computer or other programmable apparatus provide processes for implementing the functions/acts specified in the flowchart and/or block diagram block or blocks.

The flowchart and block diagrams in the figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. Each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

Computer system 10 carries out program instructions for an integrated circuit design process that uses novel placement techniques to align selected datapaths of the design along a preferred direction. Accordingly, a program embodying the invention may include conventional aspects of various placement tools, and these details will become apparent to those skilled in the art upon reference to this disclosure.

Referring now to FIG. 3A, there is depicted an example of a simplified bit stack 50 of an integrated circuit design, comprised of five cells or blocks 52a, 52b, 52c, 52d, 52e having four true nets 54a, 54b, 54c, 54d. The present invention inserts an artificial alignment net in the netlist for the datapath which interconnects every node in the bit stack. FIG. 3B illustrates the addition of the artificial alignment net 56 to create a modified bit stack 50'. This alignment net 56, when used in conjunction with edge weighting based on a preferred direction of the layout, significantly straightens out the datapath without the need for manual packing and without impacting the analysis of the other nets. Those skilled in the art understand that FIG. 3B is not a physical representation of the layout, i.e., the alignment net 56 is not intended to be shown with any particular geometry. Rather, that figure is a conceptual representation of a new interconnection which is added to the netlist and persists throughout the multiple iterations of global placement. Since alignment net 56 is not a true net, it is removed from the netlist prior to routing.

FIG. 4 provides a contrasting image of how the integrated circuit design shown in FIG. 1 might be placed in accordance with the present invention. The improved layout 60 includes cells 62 interconnected to again form five bit stacks 64, but now the aligned bit stacks have the flexibility for placement around fixed objects 66. This placement is achieved with a single placer, i.e., there is not separate placement of the datapaths and random logic and, subject to the alignment constraint, the total wire length of the design is optimized. The result is a much smaller overall placement area solution than before, which in turn improves timing.

The cells defining a datapath group can be logically associated according to their related functionality, and can basically be any schematic fragment, including a set of circuitry or logic devices, usually bounded by registers, primary inputs/outputs, or black boxes. Any datapaths in the integrated circuit design can be aligned; the circuit designer can manually identify them in the design, or the automated design tool can be programmed to define critical logic based on interconnection rules and use datapath extractors to determine the datapaths. For example, a single bit stack may comprise a high fanout net that improves through alignment, buffers that need careful placement to facilitate routing of large buses, a latch structure, or a branch of a clock tree. By forcing alignment on a clock tree, the invention can improve the overall power solution by reducing the routing load on the clocks. The HDL file initially received by computer system 10 can optionally include an identification of the datapaths in the integrated circuit design which are to be aligned.

Figure 5:
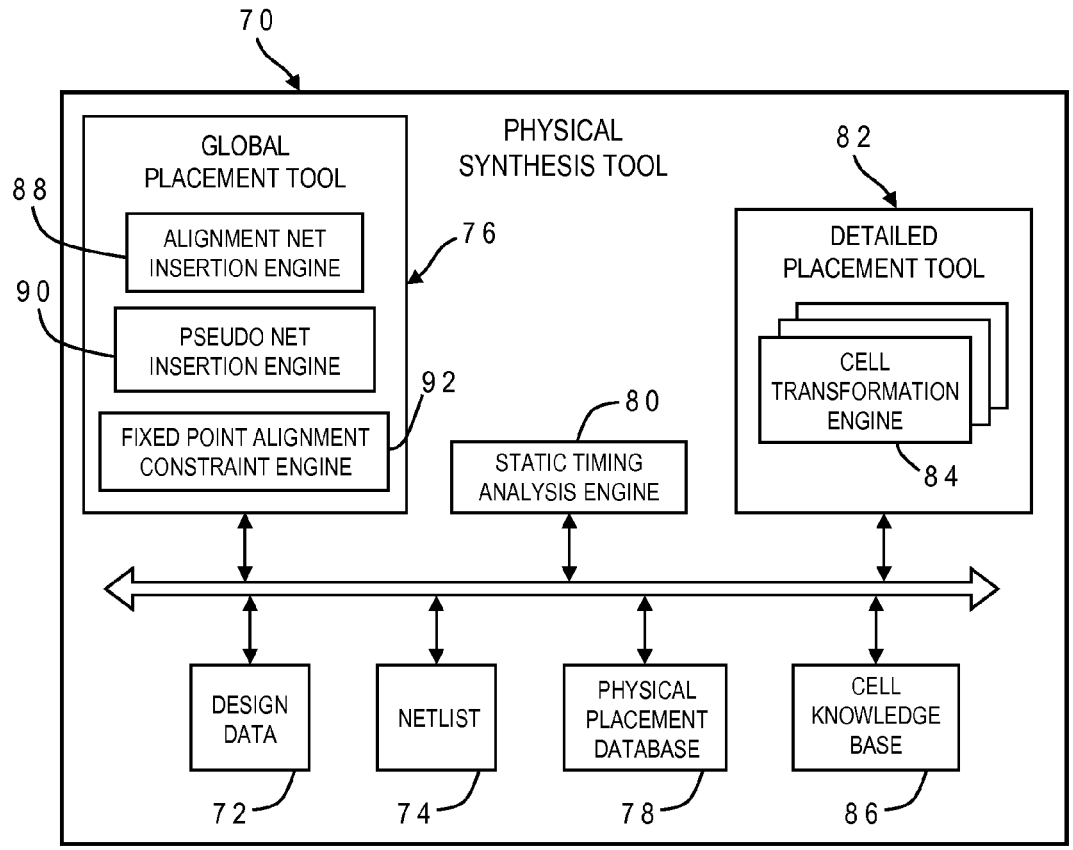
FIG. 5 is a block diagram of one embodiment of a physical synthesis tool constructed in accordance with of the present invention which provides for insertion of alignment nets along for critical datapaths.

FIG. 5 depicts one example of a physical synthesis tool in which the improved placement mechanisms of the illustrative embodiments may be implemented. The elements shown in FIG. 5 may be implemented in software, hardware, or any combination of software and hardware without departing from the spirit and scope of the illustrative embodiments. For example, in one illustrative embodiment, the elements of FIG. 5 are implemented as software instructions, stored in one or more data storage devices such as a hard drive 24 of computer system 10, and subsequently executed by processors 12.

Physical synthesis tool 70 may include features of any commercial physical synthesis tool (such as Synopsys IC Compiler within the Synopsys Galaxy Design Platform, Cadence Encounter Digital Implementation System, Magma Talus Platform, and the like), augmented to implement the preferred direction/orientation based placement mechanisms of the present invention. Physical synthesis tool 70 comprises at least the components depicted in FIG. 5 but may comprise other components as well, as will be readily apparent to those of ordinary skill in the art in view of the present detailed description, without departing from the spirit and scope of the illustrative embodiments.

In this embodiment physical synthesis tool includes a design data 72 which holds the set of design rules and specifications that are adhered to within the current device data set. Netlist 74 is the netlist for the current semiconductor device which is being designed, i.e., the list of the electrical components in the design and the interconnections for those components. Global placement tool 76 places the geometries associated with the components indicated in netlist 74 into a global device geometry. The term "place" or "placement" as used herein means to put a simulated geometry of a device component within the design layout, not actual physical placement of a component. Global placement tool 76 places each of the components of the device into the confines of a region of the device having defined borders, and interconnects the components together in accordance with the netlist. Global placement tool 76 also checks for placement legality. An illegal placement has cells whose areas overlap and/or are not placed in valid placement sites.

In accordance with the illustrative embodiments, global placement tool 76 performs global placement operations based on a preferred direction or orientation of the cells of the semiconductor device design, or a portion thereof that is the subject of the placement process. Global placement tool 76 is preferably a force-directed placer and performs directional weighting, that is, it can assign different weights to different wire sections depending upon whether they extend along the preferred direction. However, the alignment net insertion feature of the present invention can be used with other types of placers as well. Global placement tool 76 includes an alignment net insertion engine 88 to add alignment nets to the netlist for selected datapaths. As explained above, a given alignment net interconnects all cells of the datapath. The same alignment nets are retained in the design for each iteration of global placement.

Global placement tool 76 also utilizes a pseudo net insertion engine 90 that performs pseudo net insertion. The pseudo nets are added during every iteration of global placement after spreading (or after the lookahead legalization step of the SimPL algorithm), so as to enforce spreading during the subsequent solver step, and are discarded at the end of the current iteration.

Depending upon how a designer wants to align a certain set of cells, the net weightings may be adjusted such that the global placement tool 76 finds locations for the set of cells with a radically high/low aspect ratio, i.e., a high aspect ratio along the preferred direction and a low aspect ratio along the non-preferred direction. For example, if a designer wants to align cells vertically, by increasing x-directional (horizontal) weighting by a factor of 100, for example, the linear system solver of the directional weighting and insertion engine 90 extremely optimizes the wirelength only in the x-dimension and generates a very compact placement along the x-direction, resulting in a tall and narrow placement for that set of cells. The alignment weighting should be significantly stronger that any spreading forces applied by the placer to result in a compact solution in the non-preferred direction with spreading mostly along the preferred direction. The preferred direction or orientation of the cells may be specified, for example, in design data 72, or may be determined based on a knowledge base of types of standardized cells from cell knowledge base 86. Alternatively, physical synthesis tool 70 may perform analysis of cells of the integrated circuit design and determine a preferred direction or orientation of the particular cells based on a physical layout of the electrical components, pin locations, etc.

While the description refers to "horizontal" and "vertical" directions, those skilled in the art will appreciate that the invention may be applied to any direction, including diagonal directions, and the invention does not even need to rely on a Cartesian coordinate system as it can also be implemented in non-orthogonal systems and even with other coordinate systems such as polar. Similarly the invention is not limited to two dimensions, and is not limited by any particular weighting factor. Furthermore, while illustrative embodiments are described in terms of the preferred direction being a single direction, the invention may be used with a plurality of preferred directions, and each of the preferred directions may have relatively different levels of preference, i.e. there may be different increases in weighting for different directions.

In the illustrative embodiment global placement tool 76 further comprises a fixed point alignment constraint engine 92. While the use of alignment nets is effective at providing some straightening of the datapath along the preferred direction, directional weighting may not always generate a perfectly aligned placement of the cells. Based on the post-spreading locations of the cells, the fixed point alignment constraint engine 92 operates to perfectly align positions of the cells connected with alignment nets. After each spreading step, the global placement algorithm generates fixed-points (zero-area anchors) which provide trajectories of the cells. The cells and corresponding fixed-points are connected by two-pin pseudo nets, and these nets exert pulling forces. During the following global placement iteration, these pulling forces reduce the amount of cell overlap. A constraint is used to force alignment during spreading (after fixed-point generation) which minimizes wrong-way perturbations in the bit stack. The fixed point alignment constraint may be applied in two steps. First, spreading generates a fixed-point location for all cells. Second, for all cells in datapath group, a new fixed-point is added. Those locations are modified based on the geometric mean parallel to the datapath (preferred) direction. The addition of the alignment constraint on the fixed points provides the global placer a method to reduce the cell overlap within the design while maintaining the alignment of the bit stack. Pseudo net insertion engine 90 can control the weighting on the pseudo nets using a linear weighting factor $\alpha$. During early iterations of global placement, greater significance is applied to interconnect minimization as the relative cell ordering stabilizes, by starting with $\alpha$ small a value and gradually increasing throughout each global placement iteration. Weighting in this manner provides flexibility to the placer during the early stages while tightening the constraints for no overlap and alignment at the end of global placement.

Global placement tool 76 stores the information for all of the placements in the physical placement database 78. Based on the global placement obtained using the orientation-based alignment net and pseudo net weighting and insertion mechanisms and/or the fixed point mechanisms, detailed placement operations may further be performed by detailed placement tool 82. Even after performing improved global placement using the mechanisms of the illustrative embodiment, some amount of overlap may still be present and/or improvement to wirelength may still be obtainable. The elimination of the remaining overlap and fine tuning of the wirelength may be achieved through use of detailed placement and legalization mechanisms.

Datapath driven detailed placement engine 82 performs movements on cells, referred to herein as cell transformations, along the preferred direction of the cells. Datapath driven detailed placement engine 82 ensures that these transformations are legal, e.g., overlaps of cells are avoided and other specified constraints on placement of the cells are satisfied. Datapath driven detailed placement engine 82 may comprise one or more cell transformation engines 84 for performing one or more types of cell transformations on the placement solution obtained from the global placement tool 76. These one or more cell transformation engines 84 may perform various types of cell transformations depending upon the particular desired implementation. Such cell transformations are generally known in the art but are not constrained to preferred directions, including cell swapping, cell shifting, and white space insertion. However, in accordance with the illustrative embodiments, regardless of which particular types of cell transformations are used, the cell transformations are preferably performed with regard to the preferred direction of the cells.

For example, one cell transformation engine 84 may perform a cell swapping transformation in which cells are swapped by swapping locations of the cells, e.g., cell A is placed at a location of cell B and cell B is placed at a location of cell A. In accordance with the illustrative embodiments, the search for cells that can be swapped in this manner is constrained to the preferred direction. Thus, for example, if the preferred direction is a y-direction (vertical), then cells having a center point or portion of their area that is within a given tolerance of a y-axis passing through a selected cell are the only ones considered as candidates for swapping. For example, if cell A is a selected cell, then only cells that are within a given tolerance of a y-axis passing through a center of cell A are considered as candidates for swapping. Other criteria generally known in the art for performing swapping of cells may then be used with these candidates to determine an optimum configuration of the cells.

Similarly, as another example, a cell shifting transformation engine may be provided which performs an incremental shifting of cells. The incremental shifting, in accordance with the illustrative embodiments is performed along one or more of the preferred directions. For example, if the preferred direction is a y-direction, the shifting of cells is only performed with regard to a y-axis running through a selected cell. Only other cells having a center point or a portion of their area whose position is within a given tolerance of this y-axis are considered as candidates for cell shifting.

As a further example, a white space insertion transformation engine may be provided which searches along a preferred orientation of a selected cell, or set of cells, to find an amount of unoccupied area, i.e., white space, into which a cell may be moved in order to achieve a better wirelength or achieve an improved configuration with regard to one or more design goals. Thus, a primary distinction between the cell transformations of the illustrative embodiments and known mechanisms is that the cell transformations are constrained to the defined or determined direction of the cells that are the subject of the placement operations.

Physical synthesis tool 70 may have a static timing analysis engine 80 incorporated into the tool for performing static timing analysis on the resulting design to ensure that timing constraints for the semiconductor device are satisfied by the resulting design and if not, identifying violations so that the design may be modified to achieve a desired timing. Although not shown in FIG. 5, other verification mechanisms may also be included in the physical synthesis tool 70, such as a dynamic timing analysis engine, or the like, without departing from the spirit and scope of the illustrative embodiments. The result is a verified design of an integrated circuit device that has an optimized placement of cells based on a preferred direction of the cells.

Applying hard constraints like forced alignment in the early stages of wirelength optimization may disrupt the original optimization and can lead to a solution that suffers from sub-optimality in terms of overall wirelength. Additionally, changing the constraints at a high rate during the late stages of wire length optimization can cause oscillation in the placement solution and thus inhibit convergence. In order to alleviate these concerns, the illustrative implementation of the present invention utilizes a skewed weighting process applied to each alignment net. The skewed weight for each datapath group is gradually increased during each iteration. The rate of change of the weighting value increases slowly during the initial stages of global placement, increases more rapidly during the middle stages, and slows again near the end of global placement. If n is the global placement iteration number and M is its upper bound, the alignment weight schedule function p(n) for each iteration n is defined as $$p(n) = \begin{cases} \dfrac{8n^2}{M^2} & 0 \leq n < M/4 \\ 1 - \dfrac{8(n-M/2)^2}{M^2} & M/4 \leq n \leq 3M/4 \\ \dfrac{8(n-M)^2}{M^2} & 3M/4 < n \leq M \end{cases}$$

Figure 6:
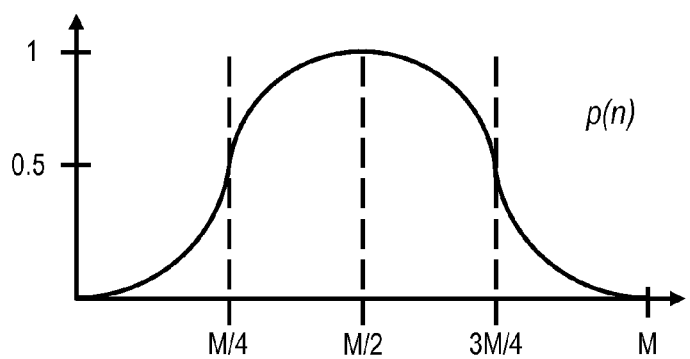
FIG. 6 is a graph depicting a skewed weighting function for datapath straightening in accordance with one implementation of the present invention.

This function is graphically depicted in FIG. 6.

Figure 7:
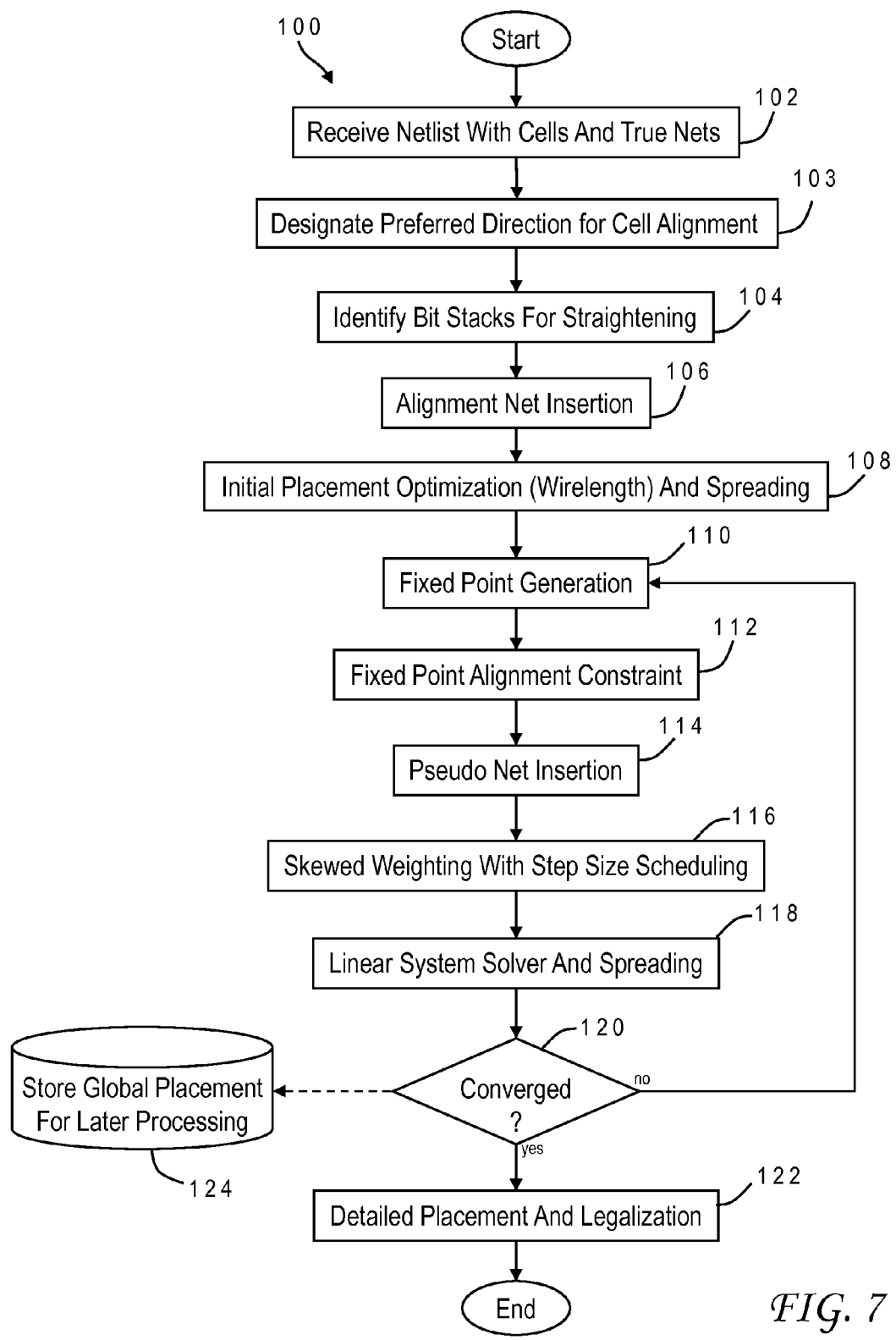
FIG. 7 is a chart illustrating the logical flow for a placement process in accordance with one implementation of the present invention.

The invention may be further understood with reference to the chart of FIG. 7 which illustrates one implementation for a placement process 100 as part of the physical synthesis of an integrated circuit design. The process may be implemented within a physical synthesis tool, such as physical synthesis tool 70 in FIG. 5, and executed on a computer system such as computer system 10. The operation starts by receiving a netlist with cells and true nets interconnecting the cells (102). Bit stacks are identified in the netlist corresponding to the datapaths for which alignment is desired along the designated direction (104), and alignment nets are accordingly inserted (106). An initial placement for the design is generated and a spreading operation is applied (108). For example, this initial placement design may be generated using a linear system solution to obtain a globally optimal solution in terms of a specified design objective, e.g., a half-perimeter wirelength minimization objective, with no spreading constraints. Thereafter, a spreading operation may be applied to the HPWL optimized global placement solution to reduce the overlap. Fixed point locations for the cells connected with alignment nets are generated based on the geometric mean parallel to the desired datapath direction (110). A fixed point alignment constraint is applied (112), and pseudo nets are inserted between each cell in the linear system solution and its corresponding expected location obtained after spreading (114). The fixed points and pseudo nets increase spreading by perturbing the linear system to achieve less overlap. The alignment weights are increased during each iteration to according to the step size scheduling of FIG. 6 (116). The linear system solver is invoked with regard to the directional weightings and inserted alignment nets and pseudo nets and spreading is performed using fixed point information (118). The linear system solver solves a linear system, e.g., Ax=b where A is a matrix, b is a vector, and x is the position vector. Solving this linear system can be interpreted as finding the global optimum position vector x that minimizes total HPWL. A determination is then made as to whether the placement has converged (120). If the placement has not yet converged, the process iteratively repeats at block 110. If the placement has converged, datapath-driven detailed placement and legalization can be performed (122), or the optimized global placement can be stored for later processing (124).

The present invention thereby provides an improved placement method which efficiently aligns selected datapaths while retaining flexibility in the placement of cells or blocks, which is particularly helpful with large block synthesis. The invention is applicable to any datapaths in the design, and achieves alignment without disrupting timing aware placement and without wirelength degradation. By applying the alignment constraints to a new artificial net, prior techniques continue to function as before, so the invention can easily be integrated into existing placement packages.

Although the invention has been described with reference to specific embodiments, this description is not meant to be construed in a limiting sense. Various modifications of the disclosed embodiments, as well as alternative embodiments of the invention, will become apparent to persons skilled in the art upon reference to the description of the invention. It is therefore contemplated that such modifications can be made without departing from the spirit or scope of the present invention as defined in the appended claims.

What is claimed is:

1. A method of placing cells in a layout of an integrated circuit design, comprising:
   receiving a circuit description of the integrated circuit design which includes a plurality of cells interconnected to form a plurality of true nets, by executing first instructions in a computer system;
   designating a preferred direction for cell alignment in the layout, by executing second instructions in the computer system;
   identifying a set of the cells defining a datapath which is to be aligned along the preferred direction, by executing third instructions in the computer system;
   inserting in the circuit description an artificial alignment net which interconnects all cells in the set, by executing fourth instructions in the computer system; and
   placing the cells in the layout of the integrated circuit design using a wirelength optimization which assigns weights to wire sections of nets based on the preferred direction, by executing fifth instructions in the computer system.

2. The method of claim 1, wherein:
   the preferred direction is a horizontal direction of the layout; and
   said placing assigns weights to vertical wire sections that are greater than weights assigned to horizontal wire sections.

3. The method of claim 1, wherein said identifying identifies multiple sets of the cells defining multiple datapaths, and said inserting inserts multiple artificial alignment nets for the multiple datapaths.

4. The method of claim 1, wherein said placing places at least one of the cells in the set on a first side of a blockage in the layout, and places at least one other of the cells in the set on a second side of the blockage which is opposite the first side along the preferred direction.

5. The method of claim 1, wherein said placing uses a linear system solver to obtain a globally optimum solution for placement of the cells which includes some overlap among the cells, and thereafter spreads the cells to reduce the overlap.

6. The method of claim 5, further comprising inserting in the circuit description a plurality of pseudo nets, a given pseudo net having an interconnection between a corresponding cell and an expected location of the corresponding cell after spreading.

7. A computer system comprising:
   one or more processors which process program instructions;
   a memory device connected to said one or more processors; and
   program instructions residing in said memory device, which when executed by said one or more processors, perform actions comprising: placing cells in a layout of an integrated circuit design by receiving a circuit description of the integrated circuit design which includes a plurality of cells interconnected to form a plurality of true nets, designating a preferred direction for cell alignment in the layout, identifying a set of the cells defining a datapath which is to be aligned along the preferred direction, inserting in the circuit description an artificial alignment net which interconnects all cells in the set, and placing the cells in the layout of the integrated circuit design using a wirelength optimization which assigns weights to wire sections of nets based on the preferred direction.

8. The computer system of claim 7, wherein:
   the preferred direction is a horizontal direction of the layout; and
   said placing assigns weights to vertical wire sections that are greater than weights assigned to horizontal wire sections.

9. The computer system of claim 7, wherein multiple sets of the cells defining multiple datapaths are identified, and multiple artificial alignment nets are inserted in the circuit description for the multiple datapaths.

10. The computer system of claim 7, wherein at least one of the cells in the set is placed on a first side of a blockage in the layout, and at least one other of the cells in the set is placed on a second side of the blockage which is opposite the first side along the preferred direction.

11. The computer system of claim 7, wherein the cells are placed using a linear system solver to obtain a globally optimum solution for placement of the cells which includes some overlap among the cells, and thereafter the cells are spread to reduce the overlap.

12. The computer system of claim 11, wherein said program instructions further insert in the circuit description a plurality of pseudo nets, a given pseudo net having an interconnection between a corresponding cell and an expected location of the corresponding cell after spreading.

13. A computer program product comprising:
   a computer-readable storage medium; and
   program instructions residing in said storage medium, which when executed by a computer system, perform actions comprising: placing cells in a layout of an integrated circuit design by receiving a circuit description of the integrated circuit design which includes a plurality of cells interconnected to form a plurality of true nets, designating a preferred direction for cell alignment in the layout, identifying a set of the cells defining a datapath which is to be aligned along the preferred direction, inserting in the circuit description an artificial alignment net which interconnects all cells in the set, and placing the cells in the layout of the integrated circuit design using a wirelength optimization which assigns weights to wire sections of nets based on the preferred direction.

14. The computer program product of claim 13, wherein:
   the preferred direction is a horizontal direction of the layout; and
   said placing assigns weights to vertical wire sections that are greater than weights assigned to horizontal wire sections.

15. The computer program product of claim 13, wherein multiple sets of the cells defining multiple datapaths are identified, and multiple artificial alignment nets are inserted in the circuit description for the multiple datapaths.

16. The computer program product of claim 13, wherein at least one of the cells in the set is placed on a first side of a blockage in the layout, and at least one other of the cells in the set is placed on a second side of the blockage which is opposite the first side along the preferred direction.

17. The computer program product of claim 13, wherein the cells are placed using a linear system solver to obtain a globally optimum solution for placement of the cells which includes some overlap among the cells, and thereafter the cells are spread to reduce the overlap.

18. The computer program product of claim 17, wherein said program instructions further insert in the circuit description a plurality of pseudo nets, a given pseudo net having an interconnection between a corresponding cell and an expected location of the corresponding cell after spreading.

19. In a placement method which places cells of an integrated circuit design in a layout area using a wirelength optimization carried out by a computer system, the improvement comprising:
   designating a preferred direction for cell alignment in the layout, by executing first instructions in the computer system;
   identifying a set of the cells defining a datapath which is to be aligned along the preferred direction, by executing second instructions in the computer system; and
   constraining movement of the set of cells during placement to align the set of cells along the preferred direction, by executing third instructions in the computer system, wherein said constraining includes inserting in the integrated circuit design an artificial alignment net which interconnects all cells in the set.

20. The improved placement method of claim 19, the cells in the layout are iteratively placed using a wirelength optimization while retaining the same alignment net in the integrated circuit design, and the wirelength optimization uses an alignment weighting value whose rate of change increases at a first rate during an initial stage of placement, increases at a second rate which is higher than the first rate during a middle stage of placement, and increases at a third rate which is lower than the second rate during a late stage of placement.

\* \* \* \* \*